United States Patent [19]

Ogle

[11] Patent Number: 5,277,751
[45] Date of Patent: Jan. 11, 1994

[54] METHOD AND APPARATUS FOR PRODUCING LOW PRESSURE PLANAR PLASMA USING A COIL WITH ITS AXIS PARALLEL TO THE SURFACE OF A COUPLING WINDOW

[76] Inventor: John S. Ogle, 1472 Pashote Ct., Milpitas, Calif. 95035

[21] Appl. No.: 900,131

[22] Filed: Jun. 18, 1992

[51] Int. Cl.$^5$ .......................................... H01L 21/00
[52] U.S. Cl. ................................ 156/643; 156/345; 118/723 I; 204/192.12; 204/192.32; 204/298.02; 204/298.08; 204/298.34; 427/569
[58] Field of Search ............... 156/345, 643; 118/723; 427/569; 204/298.02, 298.08, 298.19, 298.31, 298.34, 298.37, 192.12, 192.1, 192.32

[56] References Cited

U.S. PATENT DOCUMENTS

| | | | |
|---|---|---|---|
| 3,705,091 | 12/1972 | Jacob | 204/156 |
| 4,123,316 | 10/1978 | Tsuchimoto | 204/192.3 X |
| 4,786,352 | 11/1988 | Benzing | 156/345 |
| 4,810,935 | 3/1989 | Boswell | 204/298.37 X |
| 4,948,458 | 8/1990 | Ogle | 156/646 X |

Primary Examiner—Thi Dang
Attorney, Agent, or Firm—Thomas E. Schatzel

[57] ABSTRACT

An embodiment of the present invention is a plasma system that comprises a main coil with a flattened side and a capacitor in parallel that form a tuned circuit with radio frequency energy coupled to it through a radio frequency match by a generator. A process chamber with a quartz window and containing a low pressure gas is adjacent to the flat side of the main coil and a two-dimensional planar plasma in the shape of a circular disk is ignited and maintained by a high rate of change of the current flowing in the main coil. An electrode positioned in the chamber opposite to the window is used for attaching a semiconductor wafer for processing and a potential applied to the electrode independently controls the ion energy of ions attracted and accelerated out of the plasma.

14 Claims, 3 Drawing Sheets

METHOD AND APPARATUS FOR PRODUCING LOW PRESSURE PLANAR PLASMA USING A COIL WITH ITS AXIS PARALLEL TO THE SURFACE OF A COUPLING WINDOW

BACKGROUND OF THE INVENTION

1. Field of the Invention

The present invention relates generally to systems and methods for producing low pressure plasmas. More particularly, it relates to equipment for producing highly uniform planar plasmas which can be used for treating semiconductor wafers in low pressure processing equipment.

Plasma generation is useful in a variety of semiconductor fabrication processes including etching, deposition, ion implantation and the like. Plasmas are generally produced in a low pressure gas by accelerating naturally occurring free electrons in the gas to the gas ionization energy, typically between five and twenty electron volts. Collisions between these energetic electrons and the gas molecules occasionally cause a molecule to be ionized, releasing an additional free electron. Each additional free electron is also accelerated and can also ionize gas molecules. The resultant partially ionized gas is called a plasma.

2. Description of the Prior Art

Most matter typically exists in one of four phases: solid, liquid, gas and plasma. Super hot plasmas are used in gas chromatographs to break down samples that have been injected so that they produce characteristic spectrums of light for analysis, and in semiconductor processing equipment to etch material away from a wafer. Plasma based semiconductor equipment also includes deposition processes, resist stripping and plasma enhanced chemical vapor deposition.

Larger and more uniform plasmas need to be generated now to keep pace with the ever increasing wafer sizes being processed. Whatever the step in the process, whether etching, depositing or implanting, the effects of the plasma typically need to be uniform across the entire surface. Present day technology includes eight inch wafer processing, and twelve inch wafer process fabrication facilities (fabs) are already being planned. The prior art equipment that was suitable for plasma etching two-inch wafers is unable to produce the uniformity that translates into maximum yields and better profits for state-of-the-art fabs.

Previous planar magnetically coupled plasma (PMCP) generating methods use a varying magnetic field generated by a planar spiral coil to generate the plasma, optionally combined with an independent radio frequency power source to accelerate the ions. This method is effective in providing independent control of flux and field with inexpensive equipment and simple operation through varying magnetic field electron acceleration. But it does not provide for uniform electron acceleration, especially near the axis of the coil. A prior art plasma etching system described by the present inventor in U.S. Pat. No. 4,948,458, issued Aug. 14, 1990, comprises a chamber with a dielectric window, such as quartz. A planar coil and capacitor combination is positioned adjacent to the window, with the axis of the coil perpendicular to the window, and a powerful radio frequency source is coupled to the coil. Power transfer is maximized by impedance matching and tuning to provide resonance at 13.56 MHz, for example. Inlet ports supply a process gas to the interior of the chamber. A varying magnetic field is induced by the coil into the process gas at power levels sufficient to create a plasma of the process gas that has a circulating flow of electrons. The electron motion is closely confined to a plane parallel to the planar coil, so transfer of kinetic energy in non-planar directions is minimal. The flow of electrons is planar, albeit annular, and therefore has an eye at the axis that has a lower energy level than the other parts of the planar plasma. The eye is unavoidable with a planar coil wound in a spiral, with the axis of the coil perpendicular to the plasma plane, as shown in FIGS. 1, 3, 6 and 7 of the patent.

A very common method for accelerating free electrons for plasmas in semiconductor wafer processing is to apply a radio frequency (RF) electric field between a pair of electrically conductive plates, or electrodes, on opposite sides of a process chamber that has been filled with a low pressure process gas. A wafer to be processed is typically mounted on one of these electrodes. As such, the RF electric field will accelerate electrons in the space between the electrodes with an ionization energy perpendicular to the surface of the wafer. The accelerated electrons will collide with process gas molecules, at a frequency dependent on the gas pressure. The collisions generate ions of gas which constitute the plasma. When the electrons strike the wafer, they are captured, and this results in a negative electric charge build up on the wafer. Such a charge will attract the positive ions circulating nearby in the plasma, and pull them to the wafer at high velocity. Whether the consequential ion impacts results in etching, deposition, or other effect, is a function of the type of gas generating the ions, the surface materials of the wafer, and other process conditions.

A single RF electric field will determine the levels of both the ion flux, which is the number of ions, and the ion field, which is the energy with which the ions strike the wafer. Independent control of the ion flux and field is therefore not easy to accomplish. However, some independent control of ion flux and field can be achieved by varying the gas pressure. As the gas pressure is lowered the distance between molecules increases, so electron collisions with molecules become less frequent. Since there are fewer collisions, there are fewer ions generated. Thus the ratio of ion flux to field is, in general, decreased. At pressures below approximately twenty pascals (0.15 torr), the ratio of ion flux to field becomes excessively low. Since pressures below twenty pascals are becoming increasingly important as semiconductor feature line widths decrease, the simple parallel plate method of plasma generation has recognized limitations. Several methods have been developed to circumvent the low pressure limitations of the parallel plate system.

In a magnetically enhanced plasma generation configuration, which is sometimes referred to as magnetically enhanced reactive ion etching (MERIE), a steady transverse magnetic field is used to curve the energized electron path. This increases the distance electrons must travel before they ultimately terminate in an electrode plate or wafer. While this method will increase the ion flux to field ratio, and permits a lower pressure for a given ratio, there are serious process disadvantages in having an intense transverse magnetic field so close to a wafer. This limits the lower pressure to approximately four pascals. U.S. Pat. Nos. 4,668,338, and 4,668,365, issued to Maydan, et al., and Foster, et al., respectively, describe a common approach to magnetically enhanced plasma generation.

Another prior art method, called electron cyclotron resonance (ECR), uses microwaves to accelerate the free electrons that create the plasma in a carefully controlled transverse magnetic field. The magnetic field is adjusted so that the rotation frequency of an electron, as deflected by the magnetic field, is equal to the microwave frequency. The electron energy is increased through a number of microwave power cycles until it reaches the ionization energy. For a microwave frequency of 2.45 GHz, the ECR magnetic field is 875 gauss. ECR plasma generation is often combined with a separate RF power source that is applied to an electrode on which the wafer is mounted. The separate source provides for ion acceleration. The microwave power therefore independently controls the ion flux and the RF power independently controls the ion field. While this method provides independent flux and field control, and can operate at low pressure, it also requires large and expensive magnets, combined with critical adjustments, for proper operation.

Other methods, in particular inductively coupled plasma (ICP) and helical inductor resonator (Helicon), are also used for plasma generation, but each has disadvantages in terms of efficiency, the ability to generate effective low pressure plasmas, and the ability to provide independent flux and field control. For more information on this subject, U.S. Pat. No. 4,421,690, describes an inductively coupled plasma (ICP) plasma generation apparatus, and U.S. Pat. No. 4,160,392, describes a helical inductive resonator plasma generation configuration.

Prior art plasma generation systems are not completely satisfactory in terms of their efficiency in generating a uniform planar plasma. Independent control of ion flux and field, in a simple, inexpensive configuration with no critical adjustments, is also lacking. While the planar magnetically coupled plasma system using a planar spiral coil is capable of satisfying most of these goals, there is a discontinuity in electron acceleration at the center of the coil that is an aberration in the desired plasma uniformity. However, there are advantages in providing transverse electron acceleration through the use of controlled amount of both electric and magnetic varying fields. At pressures below approximately ten pascals, an oscillating magnetic field is generally more efficient than an oscillating electric field in coupling energy to a plasma. However, an oscillating electric field may be needed to initiate the plasma. At pressures above approximately 100 pascals, an oscillating electric field is the more efficient.

An apparatus and method for generating highly uniform plasmas within semiconductor equipment is needed to support uses in etching, deposition and ion implantation equipment. Both electric and magnetic oscillating fields for acceleration of the ionizing electrons are desirable. The apparatus should preferably include a plasma generation capability that can generate high ion flux densities over a wide pressure range with a low ion energy directed toward a wafer being processed. An independent ion acceleration capability is needed for independent control of the ion flux and field to manage the ions striking the wafer. A simplicity of adjustment and operation, efficient operation in terms of power utilization, and small size are also goals that should be realized.

Therefore, an improvement in plasma generating technology is needed. The present invention overcomes the problems traditionally associated with plasma generation.

SUMMARY OF THE PRESENT INVENTION

It is therefore an object of the present invention to provide a plasma through electron acceleration that is substantially parallel to and separated from a semiconductor wafer undergoing a process enabled by the plasma.

Briefly, an embodiment of the present invention is a plasma system that comprises a main coil with a flattened side and a capacitor that form a tuned circuit with radio frequency energy coupled to it through a radio frequency match by a generator. A process chamber with a quartz window and containing a low pressure gas is adjacent to the flat side of the main coil with the axis of the coil parallel to the surface of the window and a two-dimensional planar plasma in the shape of a circular disk is ignited and maintained by a high rate of change of the current flowing in the main coil. An electrode positioned in the chamber opposite to the window is used for attaching a semiconductor wafer for processing and a potential applied to the electrode independently controls the ion energy of ions attracted and accelerated out of the plasma.

An advantage of the present invention is that it provides a system in which ion density and energy are independently controllable.

A further advantage of the present invention is that a system is provided in which a planar plasma is produced that may be uniform over as much as a twelve inch diameter.

Another advantage of the present invention is that a system is provided in which plasmas may be ignited and maintained in process chamber pressures as low as one tenth of a Pascal.

These and other objects and advantages of the present invention will no doubt become obvious to those of ordinary skill in the art after having read the following detailed description of the preferred embodiments which are illustrated in the various drawing figures.

DETAILED DESCRIPTION OF THE PREFERRED EMBODIMENTS

Figure 1:
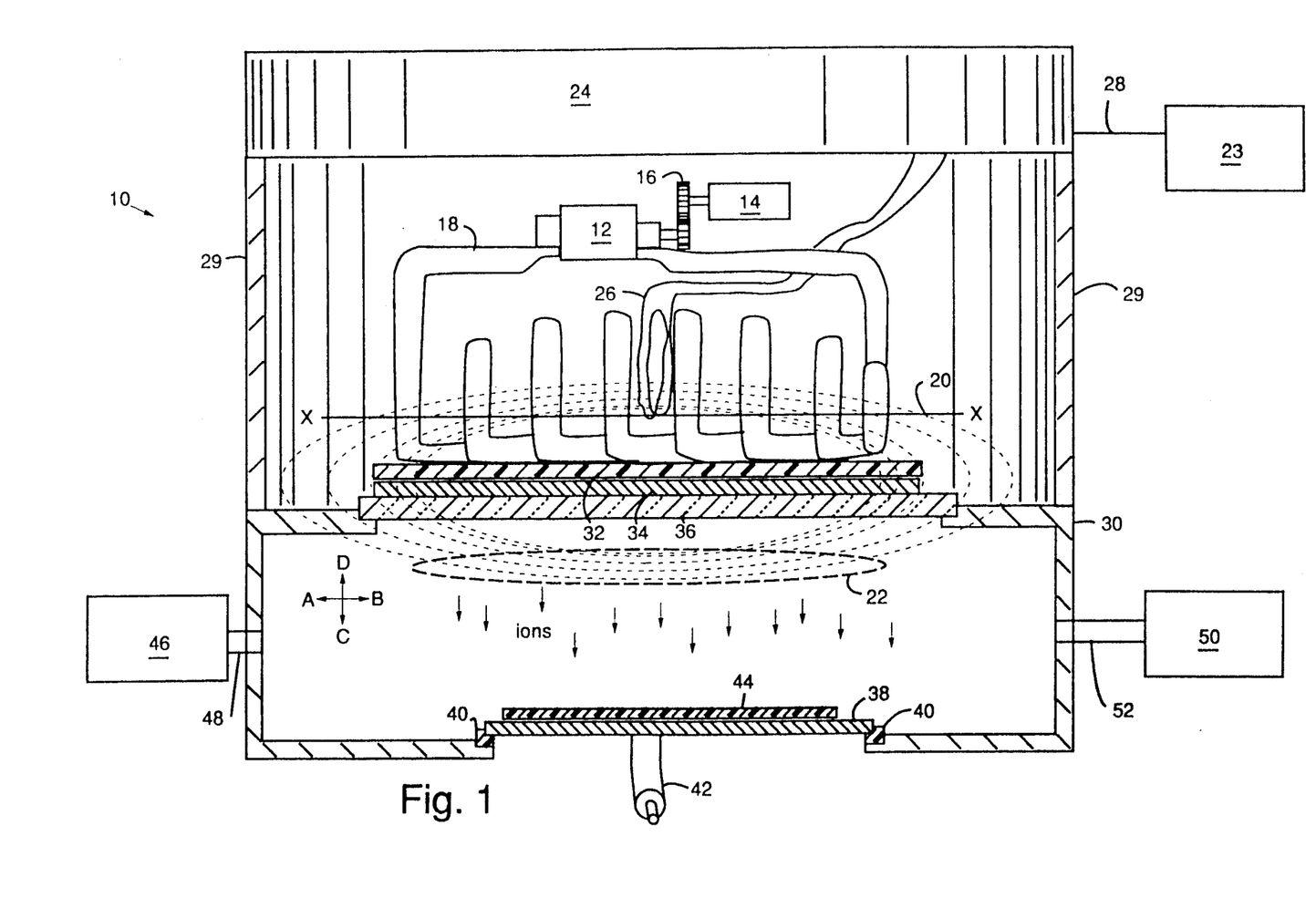
FIG. 1 is a side view of a plasma etching system of the present invention and wherein the aluminum shield and chamber have a portion cut away.

FIG. 1 illustrates a plasma etching system embodiment of the present invention, referred to by the general reference numeral 10, which comprises a vacuum variable capacitor 12 that is adjusted by a motor 14 through a gear train 16 and a main coil 18. Capacitor 12 must be a high-voltage, high-current type, with a range of three picofarads to thirty picofarads. One manufacturer of suitable devices is Jennings Corporation (San Jose, Calif.). The cost of such vacuum variable capacitors is substantial. For a less expensive but still acceptable alternative, a parallel-series network of RF transmitter fixed capacitors, such as made by High Energy Components (HEC) and CRL Components, can be substituted for vacuum variable capacitor 12, using adjustments in an external RF match. For example, two parallel strings of four, fifteen KV capacitors rated at fifty picofarads each can be used with additional smaller capacitors added for rough trimming. This combination has given good results. (This combination Yields a combined capacitor of approximately twenty-eight picofarads at sixty Kv.) The loops of main coil 18 are smaller and tighter together at the extremities of main coil 18, in order to shape a magnetic field 20 which, in turn, makes a planar plasma 22 more uniform. Typically the outside loops will be separated by 60% of the distance of the loop separation at the middle.

Main coil 18 may be constructed of ⅜ inch soft copper tubing, such as is commonly used for domestic plumbing. At radio frequencies, the majority of the current flowing in a conductor will be in the skin, so tubing functions very well and can be formed and flattened as needed. At one extreme, main coil 18 should have sufficient turns to maintain plasma 22 uniform, which is about five turns, minimum. At a maximum, main coil 18 should not include so many turns that the air gap distances between turns is so small that arcing occurs. Approximately fifteen turns is the maximum. Main coil 18 is typically twenty to thirty-five centimeters long, with a width at its widest part also typically twenty to thirty-five centimeters, and tapering down to ten to twenty centimeters across at each end. The resulting inductance is approximately four to twenty microhenries. The separation space between turns may be maintained by plastic spacers. A plastic coil-form may be used to give main coil 18 its shape and to improve its mechanical strength so that the shape does not deform in operation or in handling. Arcing between turns, if it becomes a problem, can be reduced or eliminated by immersing main coil 18 in an oil bath. The current carrying capabilities of main coil 18 can be improved by silver plating the copper tubing from which it is constructed. The shape and size of main coil 18 and the spacing between turns is typically empirically determined to obtain the desired magnetic and electric field distributions for a particular use.

Main coil 18 and capacitor 12 form a tank circuit having a natural frequency tunable by motor 14. A radio frequency (RF) generator 23 provides power to an RF match 24, which provides an optimum power transfer into main coil 18. RF generator 23 may be of the type generally used in the operation of semiconductor processing equipment and operable from about 13.56 MHz to 100 MHz, albeit 13.56 MHz is preferred. RF generator 23 will usually have a low output impedance, typically fifty ohms, and it will be capable of producing 2.5 kilowatts. RF match 24 may be a MATCHWORKS 25, as marketed by ENI Corporation, with has an auto-tuning/matching feature. RF match 24 feeds a coupling coil 26. Coupling coil 26 is preferably mounted near the center of main coil 18 and can be arranged so that it can be rotated to vary the coupling that occurs between it and main coil 18. An aluminum cylinder 29 supports RF match 24 and helps contain the radiation of electromagnetic interference (EMI). Motor 14 is used to match the tank circuit to the frequency of RF generator 24. The resultant transformer like coupling is such that field 20 is powerful enough to ignite and maintain plasma 22 within a chamber 30. An insulator 32 is placed between an electrostatic shield 34 and main coil 18 to prevent arc-over. Electrostatic shield 34 passes only electromagnetic fields and stops electrostatic fields from entering chamber 30. A planar window 36, preferably of quartz, seals the interior of chamber 30 from the outside atmosphere and allows gases to be contained at vacuum pressures. Window 36 allows magnetic field 20 to enter chamber 30, and is typically larger than the length and width of main coil 18. Main coil 18 is preferably flattened on a side placed adjacent to window 36 so that the passage of field 20 through window 36 is improved. Window 36 may be made of ceramic. However, a transparent window 36 can allow an interferometer to be used at a light frequency not interfered with by plasma 22 to take measurements of the progress of activity within chamber 30.

System 10 further comprises an electrode 38 that is electrically insulated from chamber 30 by a ring insulator 40. A connector 42 allows external electrical potentials to be applied to electrode 38 such that ions generated by plasma 22 may be attracted to a wafer 44 mounted on electrode 38. The longitudinal axis X—X of main coil 18 is substantially parallel to plasma 22, window 36 and wafer 44. Electrons within plasma 22 will typically oscillate back and forth parallel to wafer 44 for a distance of approximately 4.5 centimeters. This relatively long distance of electron oscillation affords uniformity of plasma 22. The rate of change of current (dI/dt) within main coil 18 produces the principal coupling mechanism with these electrons. The, so-called, non-uniformity of system 10 has been measured to be better than five percent. Plasma 22 is essentially two-dimensional and preferably does extend to the area of wafer 44. Ions produced in plasma 22 by the agitation of the electrons are typically accelerated in a direction "C" by electrode 38. Within chamber 30, there are preferably one or more surfaces for mounting an article or articles to be treated. Wafer 44 is typically a six-inch diameter wafer of silicon. Other embodiments of the present invention can create plasmas that are suitable for wafers twelve inches in diameter and larger. To accommodate the larger wafer sizes, the size of system 10, such as main coil 18 and chamber 30, is expanded proportionately. The flux density of ions created in plasma 22 may be controlled by adjusting the power output of generator 23. The ion energy of ions striking wafer 44 may be independently controlled by adjusting the electrical potential applied to electrode 38. A source of process gas 46 supplies chamber 30 through an inlet port 48. A vacuum pump 50 regulates the pressure within chamber 30 through an outlet port 52. Systems for supplying process gases and controlling the pressure within the enclosure are well known in the art and need not be further described. The ion density will, of course, be dependent on the gases and pressures used within chamber 30, because the density of plasma 22 depends on these parameters.

Figures 2A, 2B, 2C:
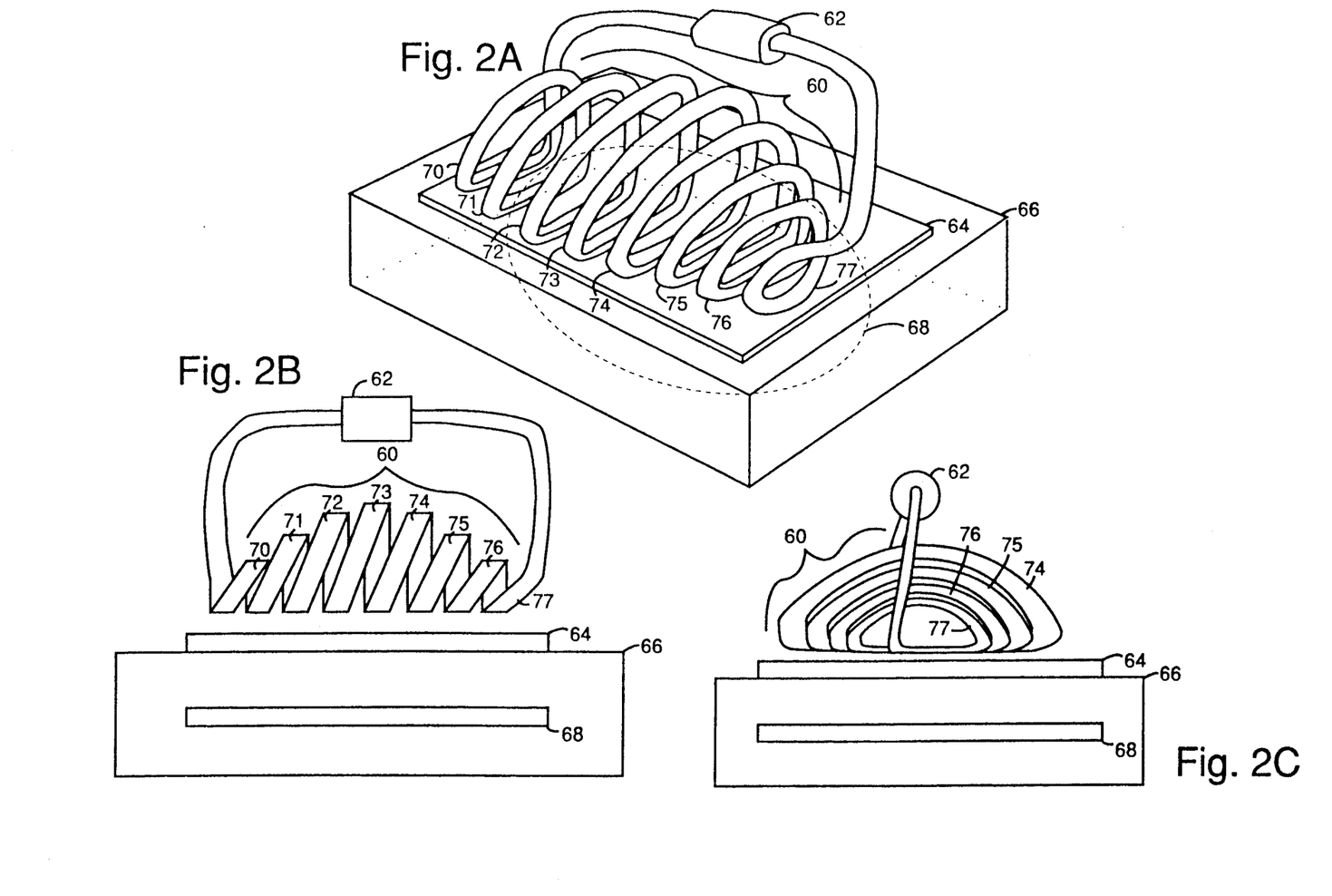
FIGS. 2A, 2B and 2C are perspective, side and end views, respectively, of an inductor and coil positioned relative to an adjacent window on an enclosure and wherein the inductor and coil are similar to those shown in FIG. 1.

FIGS. 2A, 2B and 2C illustrate a main coil 60 and a capacitor 62 that are similar in function and purpose to main coil 18 and capacitor 12 in FIG. 1. A window 64 allows a field generated by coil 60 to enter an enclosure 66 which has disposed within it a wafer 68 to be processed. Main coil 60 includes a plurality of turns 70-77. As best shown in FIG. 2C, turns 70-77 are flattened adjacent to window 64. This allows a more intense varying magnetic field to enter enclosure 66.

Figures 3, 4:
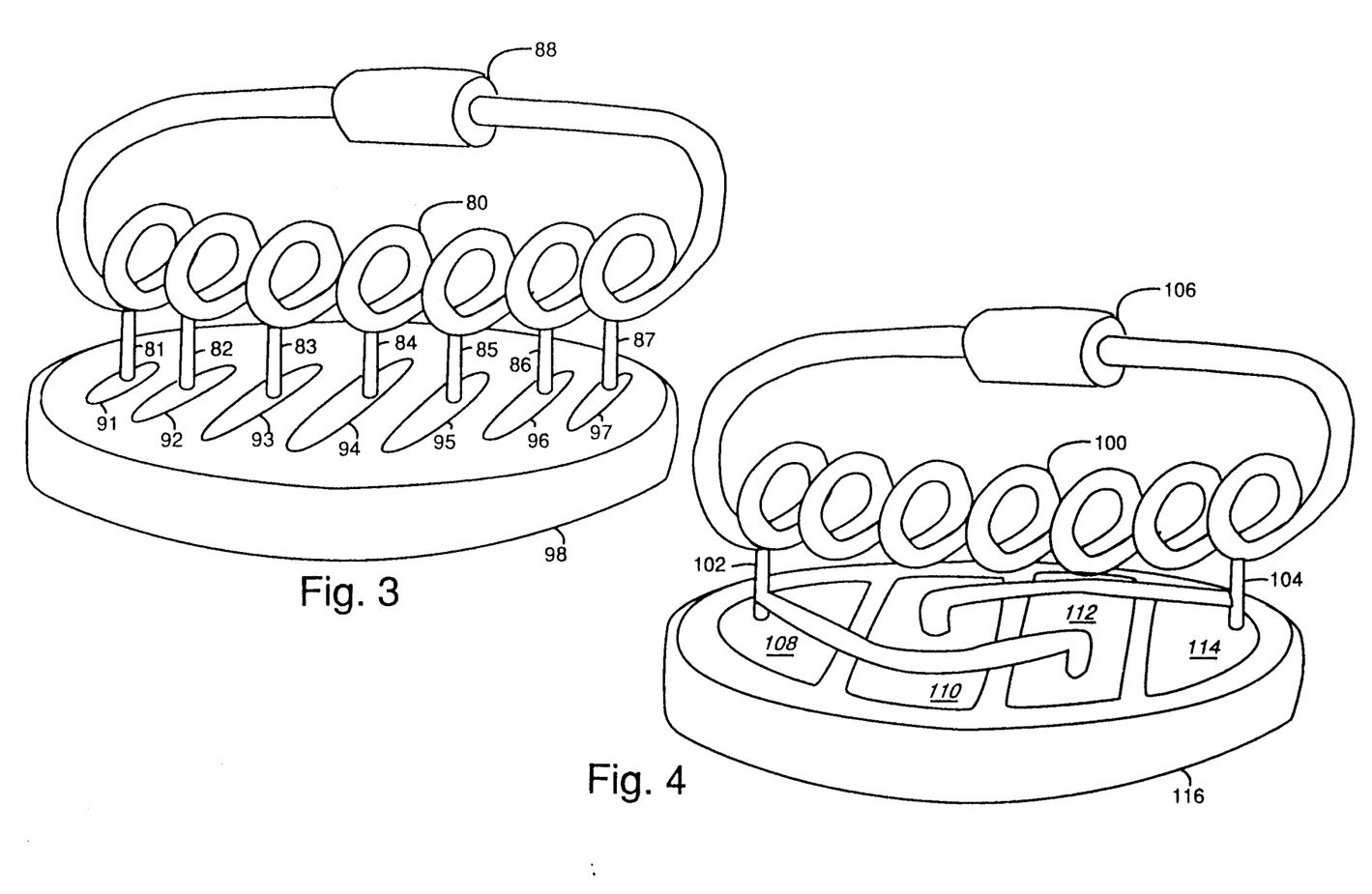
FIG. 3 is a perspective view of an alternative coil and capacitor embodiment of the present invention.
FIG. 4 is a perspective view of a still further alternative coil and capacitor embodiment of the present invention.

FIGS. 3 and 4 illustrate alternative embodiments of that shown in FIGS. 2A-2C. In FIG. 3, a main coil 80 includes a series of taps 81-87 that are connected to each turn. A capacitor 88 is connected in parallel with main coil 80. A tap or set of taps near the center of main coil 80 can thus be used to provide a path to ground or to a second source of electrostatic RF power to accelerate ions in chamber 30. Taps 81-87 are connected respectively to a series of parallel elongated plates 91-97 on a dielectric window 98. The electrical connections of plates 91-97 to points on main coil 80 are such that a portion of a voltage across the resonant circuit is more or less evenly distributed across the plates and will induce a planar plasma within an enclosure placed in close proximity and parallel to window 98.

FIG. 4 shows an alternative tapping arrangement. These taps can also be used to advantage on coils 18 and 60. Plasma generation using electric field coupling is sometimes more effective than magnetic field coupling for gas pressures above one hundred Pascals. In FIG. 4, a main coil 100 includes a pair of taps 102 and 104 that are each connected to an outside coil turn. A capacitor 106 connects to coil 100 and forms an inductive-capacitive resonant circuit. A very large voltage will develop between taps 102 and 104 when radio frequency power is coupled into coil 100 at the resonant frequency, e.g., by the method shown in FIG. 1. Taps 102 and 104 are connected to a plurality of elongated planar plates 108, 110, 112 and 114 on a plane with a dielectric planar window 116. The electrical connections of plates 108, 110, 112 and 114 with main coil 80 couple a voltage across the resonant circuit within the gas enclosure to induce a planar plasma within. The plasma will be parallel to window 116. The electrostatic field induced into the gas enclosure is primarily responsible for the generation of the plasma and the magnetic field of coil 100 is reduced, or filtered out, by separating coil 100 from the gas enclosure. Plates 108, 110, 112 and 114 are shaped as sections of a single circle in order to promote an outside circular boundary to the planar plasma. This particular shape is useful in semiconductor wafer processing because the wafers are typically round slices from a cylindrical boule of a crystal of semiconductor material.

The theory of operation of embodiments of the present invention may be understood in terms of the electron mean free path in the process gas, the electron oscillation distance for ionization energy, and the dimensions of chamber 30. The electron mean free path is defined as the average distance an electron travels between collisions with gas molecules. It is determined by the chamber gas pressure. The electron mean free path is further affected by the size of the gas molecules, the energy of the electrons, and other factors. For a pressure of one Pascal, and a maximum energy of ten electron volts, the electron mean free path distance with common process gases will be approximately three centimeters. This distance varies inversely with the pressure. For a sinusoidal electron oscillation with ten electron volts peak electron energy at an RF frequency of 13.56 MHz (a commonly used plasma generation frequency), the electron oscillation distance is approximately 4.4 centimeters. Since mass of an ion is so much greater than the mass of an electron, there will be no significant movement of the positive ions within plasma 22, assuming the power frequency remains 13.56 MHz.

Both the electron mean free path at a pressure of one Pascal and the electron oscillation distance for ionizing energy are greater than the spacing normally used between parallel plate electrodes in a plasma chamber. Therefore, an efficient plasma generation at pressures of one Pascal, or less, is not possible merely by applying RF power between a set of parallel electrodes. In the present invention, such as system 10, the chamber dimensions parallel to the electrodes are typically twenty to forty centimeters, so electrons with ionizing energy can undergo multiple oscillations parallel to wafer 44 without striking the electrodes or the chamber walls. This makes for high efficiency, in terms of conversion of electron energy to ionization energy, even for the relatively long electron mean free path at low pressure.

The electron accelerating field due to the electric field is substantially parallel to the axis of the main coil, while the electron accelerating field due to the varying magnetic field is substantially parallel to the turns of the main coil adjacent to the window, which are substantially perpendicular to the axis of the main coil. Thus either or both the varying electric and magnetic fields from the main coil 18 can be used for electron acceleration substantially parallel to surface of window 36 in the process gas inside chamber 30. Maximum coupling of both electric and magnetic fields from the main coil through the window into the chamber is provided with the main coil flattened on one side to form a series of bars adjacent to the window.

Since different applications, under different conditions, may benefit from either the electric or the magnetic field, either field can be made to dominate. Electric shield 34 (FIG. 1), includes insulated conductors substantially parallel to the axis of the main coil 18 and window 36. The varying electric field passing through the window 36 into the chamber 30 is minimized, and the varying magnetic field dominates. FIG. 3 shows that by mounting bars on posts and attaching them along the main coil parallel to the main coil axis, with the main coil spaced away from window 36 by the length of the posts, the magnetic field passing through the window is reduced and the electric field will dominate.

The independent RF source used to accelerate the ions perpendicular to the wafer is applied between the electrode on which the wafer is placed and an electrode formed either by the parallel bars of the main coil adjacent to the window or by an electric shield between the window and the main coil. This independent RF source can be applied to either the wafer electrode 38 or the electrode formed by the main coil bars or the electric shield.

The separation of the two functions, ion density (flux) and ion energy (field) is possible because the plasma itself forms a relatively good conductor, separated from the chamber surfaces and the wafer by a relatively high impedance sheath, or dark space, so the voltage from one side of the plasma to the other is relatively small, while the voltage between the electrode formed by the bars and the other electrode can be large.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is,

1. A method of planar plasma generation comprising the steps of:
   winding a main coil of soft copper tubing having between five and fifteen turns including a flattening of said coil on one side;
   connecting a high-current high-voltage capacitor to said flattened main coil;
   positioning said flattened main coil proximate to a gas enclosure with said one flattened side adjacent to said gas enclosure;
   coupling a radio frequency power source to said flattened main coil;
   optimally coupling said radio frequency power to the combination of said main coil and capacitor with a matching means to result in the generation of a planar plasma within said gas enclosure that lies in a plane substantially parallel to the axis of said flattened main coil; and
   filtering out the magnetic field of said main coil from reaching inside said gas enclosure by separating said coil and gas enclosure and communicating the potentials existing on a series of voltage taps on said main coil to a series of planar electrodes parallel to said gas enclosure wherein said planar plasma is generated by the varying electric field of said main coil.

2. An apparatus for producing a plasma, comprising:
   a gas-tight enclosure bounded at least in part by a substantially planar electrically insulating window;
   means for introducing a plurality of process gases into the enclosure;
   means for controlling the pressure of said process gases;
   a coil with a plurality of winding turns that progress along a longitudinal axis and positioned proximate to the enclosure and outside adjacent to said insulating window with said longitudinal axis of the coil oriented substantially parallel to said insulating window; and
   means for coupling a radio frequency power source to the coil to cause a current to flow through the coil wherein a planar plasma may be ignited and maintained parallel to said insulating window.

3. The apparatus of claim 1, wherein:
   a side of said coil adjacent to said window is flattened to substantially improve coupling between the coil and said plasma within the enclosure.

4. The apparatus of claim 1, further comprising:
   an electrode mounted inside the enclosure opposite to said insulating window and having a connection for a source of radio frequency power wherein ions created within said plasma may be imparted an acceleration energy in the direction of the electrode.

5. The apparatus of claim 1, wherein:
   a source of radio frequency power is applied between a point of said coil and a ground defined by the potential of the conductive portions of said enclosure.

6. An apparatus for producing a plasma, comprising:
   an enclosure having an interior bounded at least in part by an electrically insulating window;
   means for introducing a process gas into the enclosure;
   means for controlling the pressure of said process gas while in the chamber;
   a resonant circuit including at least one inductor and one capacitor; and
   a series of elongated plates positioned side-by-side on said insulating window such that plates are substantially parallel, each plate including an electrical connection to points on said resonant circuit wherein a portion of a voltage across said resonant circuit also is distributed across the plates for inducing a planar plasma within the enclosure that is parallel to said window.

7. The apparatus of claim 6, further comprising:
   means for generating a stable magnetic field having a field direction that is substantially perpendicular to said window.

8. The apparatus of claim 6, further comprising:
   an electrode mounted inside the enclosure opposite to said insulating window; and
   means for applying radio frequency power to said electrode.

9. An apparatus for treating articles with a plasma, said apparatus comprising:
   an enclosure having an interior for supporting said articles to be treated, the enclosure being bounded at least in part by an electrically insulating window;
   an electrically conductive coil mounted external to said enclosure adjacent to said window, with a longitudinal axis of said coil substantially parallel to the surface of said window for generating an intense varying internal magnetic field along said longitudinal axis and a weaker external return magnetic field outside the coil wherein a plasma may be maintained inside said plasma chamber by said weaker external return magnetic field passing through said window;
   means for coupling radio frequency power to said coil to cause a radio frequency current to flow through said coil;
   means for introducing process gases into said enclosure; and
   means for controlling the pressure inside said chamber.

10. A plasma generation device for generating a substantially two-dimensional planar plasma parallel to a semiconductor wafer being processed, the device comprising:
    a main coil including between five and fifteen turns wound along a longitudinal axis for generating an intense varying internal magnetic field along said longitudinal axis of the main coil and a weaker external return varying magnetic field outside the main coil, wherein said planar plasma may be maintained inside a plasma chamber by said weaker external return varying magnetic field passing through an adjacent insulating window;
    a capacitor connected to the main coil for tuning the natural oscillating frequency of the combination of the main coil and capacitor;
    a process chamber for receiving gas and supporting a substantially two-dimensional planar plasma parallel to the semiconductor wafer being processed, the process chamber having said adjacent insulating window in close proximity to the main coil and oriented with the axis of the main coil substantially parallel to the semiconductor wafer being processed;

means for radio frequency power injection coupled to the main coil wherein the two-dimensional planar plasma is generated; and an electrode for accelerating ions produced from the two-dimensional planar plasma toward the semiconductor wafer in a direction normal to the plane of the semiconductor wafer.

11. The device of claim 10, wherein:

the main coil comprises soft copper tubing;

the capacitor is a vacuum variable type; and said insulating window in the process chamber is a quartz window positioned between the main coil and the two-dimensional planar plasma.

12. The device of claim 10, further comprising:

an electrostatic shield is placed between the main coil and the two-dimensional planar plasma wherein only an electromagnetic field generated by the main coil is strong enough within the process chamber to ignite and maintain the two-dimensional planar plasma.

13. A system for generating a uniform planar plasma within a gas-tight, gas-filled plasma chamber with an electrically insulating window, comprising:

a coil with a plurality of winding turns that progress along a longitudinal axis and that is positioned proximate to the enclosure and outside adjacent to said insulating window with said longitudinal axis of the coil oriented substantially parallel to said insulating window for generating an intense varying internal magnetic field along said longitudinal axis and a weaker varying external return magnetic field outside the coil wherein a plasma may be maintained inside said plasma chamber by said weaker external return magnetic field passing through said insulating window.

14. A plasma generation device for generating a two-dimensional planar plasma parallel to a semiconductor wafer being processed, the device comprising:

a main coil including between five and fifteen turns wound along a longitudinal axis;

a capacitor connected to the main coil for tuning the natural oscillating frequency of the combination of the main coil and capacitor;

a process chamber for receiving gas and supporting a substantially two-dimensional planar plasma parallel to the semiconductor wafer being processed, the process chamber being in close proximity to the main coil and oriented with the axis of the main coil substantially parallel to the semiconductor wafer being processed;

means for radio frequency power injection coupled to the main coil wherein the two-dimensional planar plasma is generated;

an electrode for accelerating ions produced from the two-dimensional planar plasma toward the semiconductor wafer in a direction normal to the plane of the semiconductor wafer;

an electrostatic shield placed between the main coil and the two-dimensional planar system wherein only an electromagnetic field generated by the main coil is strong enough within the process chamber to ignite and maintain the two-dimensional planar plasma; and an insulation layer that is placed between the main coil and the electrostatic shield for preventing electrical arcing of the main coil to the electrostatic shield.

* * * * *

UNITED STATES PATENT AND TRADEMARK OFFICE
CERTIFICATE OF CORRECTION

PATENT NO. : 5,277,751
DATED : Jan. 11, 1994
INVENTOR(S) : John S. Ogle It is certified that error appears in the above-identified patent and that said Letters Patent is hereby corrected as shown below:

Column 9, line 48 - Claim 3, line 1, change "claim 1" to --claim 2--;

Column 9, line 52 - Claim 4, line 1, change "claim 1" to --claim 2--; and

Column 9, line 59 - Claim 5, line 1, change "claim 1" to --claim 2--.

Signed and Sealed this

Tenth Day of May, 1994

Attest:

BRUCE LEHMAN

Attesting Officer  Commissioner of Patents and Trademarks